(12) United States Patent
Hsieh et al.

(10) Patent No.: US 7,744,410 B2
(45) Date of Patent: Jun. 29, 2010

(54) SINKING TYPE ELECTRICAL CONNECTOR AND ASSEMBLY OF THE SINKING TYPE ELECTRICAL CONNECTOR AND A CIRCUIT BOARD

(75) Inventors: Sung-Yu Hsieh, Taipei Hsien (TW); Wen-Chin Wu, Taipei Hsien (TW)

(73) Assignee: Wistron Corporation, Taipei Hsien (TW)

( * ) Notice: Subject to any disclaimer, the term of this patent is extended or adjusted under 35 U.S.C. 154(b) by 0 days.

(21) Appl. No.: 12/495,265

(22) Filed: Jun. 30, 2009

(65) Prior Publication Data

US 2010/0099274 A1    Apr. 22, 2010

(30) Foreign Application Priority Data

Oct. 20, 2008    (TW) .............................. 97140134 A

(51) Int. Cl.
*H01R 13/60* (2006.01)
*H01R 13/66* (2006.01)

(52) U.S. Cl. ..................................................... 439/569

(58) Field of Classification Search ................ 439/567, 439/569, 570, 571, 573, 378, 55
See application file for complete search history.

(56) References Cited

U.S. PATENT DOCUMENTS

| | | | | |
|---|---|---|---|---|
| 5,382,168 A | * | 1/1995 | Azuma et al. | 439/65 |
| 6,024,602 A | * | 2/2000 | Mchugh et al. | 439/567 |
| 6,190,201 B1 | * | 2/2001 | Shih et al. | 439/567 |
| 6,299,461 B1 | * | 10/2001 | Zhu et al. | 439/76.1 |
| 6,468,109 B1 | * | 10/2002 | Wu | 439/567 |
| 6,469,905 B1 | * | 10/2002 | Hwang | 361/756 |
| 7,307,221 B2 | | 12/2007 | Pan | |

* cited by examiner

*Primary Examiner*—Chandrika Prasad
(74) *Attorney, Agent, or Firm*—Whyte Hirschboeck Dudek SC

(57) ABSTRACT

A sinking type electrical connector is adapted for coupling to a circuit board. The sinking type electrical connector includes a body and at least one limiting unit. The body has a front end portion, a connecting portion provided in the front end portion, and a top surface. The limiting unit is provided at one side of the body and includes a plurality of limiting portions respectively located at different levels. A selected one of the limiting portions of the limiting unit which are at different levels is brought to engage the circuit board so that a distance from the top surface of the body to the circuit board is changeable.

20 Claims, 7 Drawing Sheets

SINKING TYPE ELECTRICAL CONNECTOR AND ASSEMBLY OF THE SINKING TYPE ELECTRICAL CONNECTOR AND A CIRCUIT BOARD

CROSS-REFERENCE TO RELATED APPLICATION

This application claims priority of Taiwanese Application No. 097140134, filed on Oct. 20, 2008.

BACKGROUND OF THE INVENTION

1. Field of the Invention

The invention relates to a sinking type electrical connector, more particularly to a sinking type electrical connector that permits adjustment of a depth to which the electrical connector can sink below a circuit board.

2. Description of the Related Art

In view of users' requirements for electronic products with reduced sizes and weights, a number of ultra-thin notebook computer designs have been released in the notebook computer market, bringing the trend of the notebook computer market toward miniaturization. However, in order to realize a miniaturized design, the height of a standard electrical connector is usually a primary problem in the arrangement of internal structures. Therefore, sinking type electrical connectors have been developed.

Referring to FIG. 1, a conventional sinking type electrical connector 11 achieves an effect of "sinking" below a circuit board 12 by means of two tabs 111 (only one is shown) protruding from two sides thereof and mounted on a top surface of the circuit board 12 so that a part of the electrical connector 11 sinks into a space present between the circuit board 12 and a housing (not shown) of an electronic product. However, since there is only one tab 111 provided at each side of the electrical connector 11, the depth to which the electrical connector 11 can sink below the circuit board 12 (or referred to as a sinking depth) is fixed and cannot be varied. Therefore, if the electrical connector 11 needs to have a different sinking depth, developing a new electrical connector is required, which means additional cost and time. In addition, since a production unit is required to prepare electrical connectors having different specifications for different types of notebook computers, inventory cost is relatively high. Thus, there is still room for improvement.

SUMMARY OF THE INVENTION

Therefore, an object of the present invention is to provide a sinking type electrical connector that permits adjustment of a depth to which the electrical connector can sink below a circuit board.

Another object of the present invention is to provide an assembly of a sinking type electrical connector and a circuit board that permits adjustment of a depth to which the electrical connector can sink below the circuit board.

Accordingly, the sinking type electrical connector of the present invention is adapted for coupling to a circuit board, and includes a body and at least one limiting unit. The body has a front end portion, a connecting portion provided in the front end portion, and a top surface. The limiting unit is provided at one side of the body and includes a plurality of limiting portions respectively located at different levels. A selected one of the limiting portions of the limiting unit which are at different levels is brought to engage the circuit board so that a distance from the top surface of the body to the circuit board is changeable.

In an embodiment of the present invention, the limiting portions are tabs protruding laterally from the body, and the tabs are arranged out-of-line with each other in a front-and-rear direction. Preferably, the sinking type electrical connector further includes at least one insert piece extending downwardly from the body for insertion into the circuit board.

In an embodiment of the present invention, the sinking type electrical connector further includes at least one insert piece extending downwardly from the body for insertion into the circuit board. The insert piece extends convergently in a downward direction. The limiting portions are portions of the insert piece at different levels. There are two types of the insert piece. The first type of the insert piece is of a substantially wedged shape. The second type of the insert piece has two lateral edges which are stepped. Preferably, the sinking type electrical connector further includes a protruding block protruding from another side of the body. The protruding block has a stepped bottom surface part extending rearwardly and upwardly. The sinking type electrical connector further includes a plurality of terminals provided in the body. The terminals protrude outwardly of the bottom surface part of the protruding block and are stepped.

The assembly of a sinking type electrical connector and a circuit board of the present invention includes a circuit board and a sinking type electrical connector. The circuit board is provided with a receiving recess and at least one positioning hole. The sinking type electrical connector includes a body, at least one insert piece which corresponds in number to the positioning hole, and at least one limiting unit. The body has a front end portion, a connecting portion provided in the front end portion, and a top surface. The insert piece extends downwardly from the body for insertion into the positioning hole such that the body is received and positioned in the receiving recess. The limiting unit is provided at one side of the body and includes a plurality of limiting portions respectively located at different levels. A selected one of the limiting portions of the limiting unit which are at different levels is brought to engage the circuit board so that a distance from the top surface of the body to the circuit board is changeable.

In an embodiment of the present invention, the limiting portions are tabs protruding laterally from the body, and the tabs are arranged out-of-line with each other in a front-and-rear direction. One of the tabs abuts against the circuit board when the sinking type electrical connector is coupled to the circuit board.

In an embodiment of the present invention, the insert piece extends convergently in a downward direction. The limiting portions are portions of the insert piece at different levels. There are two types of the insert piece. The first type of the insert piece is of a substantially wedged shape. The second type of the insert piece has two lateral edges which are stepped. Preferably, the sinking type electrical connector further includes a protruding block protruding from another side of the body. The protruding block has a stepped bottom surface part extending rearwardly and upwardly. The sinking type electrical connector further includes a plurality of terminals provided in the body. The terminals protrude outwardly of the bottom surface part of the protruding block and are stepped.

The effect of this invention is that, with the configuration of the limiting unit including a plurality of limiting portions located at different levels, a selected one of the limiting portions can be brought to engage the circuit board so that a distance from the top surface of the body to the circuit board is changeable, thereby achieving the object of adjusting the depth to which the electrical connector can sink below the circuit board.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

The aforesaid and other technical contents, features, and effects of the present invention will become apparent in the following detailed description of four preferred embodiments with reference to the accompanying drawings. Directional terminologies, such as top, bottom, left, right, front and rear, as referred to in the following embodiments are defined in relation to the drawings. The directional terminologies as used are intended to facilitate description of the present invention rather than limit the scope of the present invention.

Figure 1:
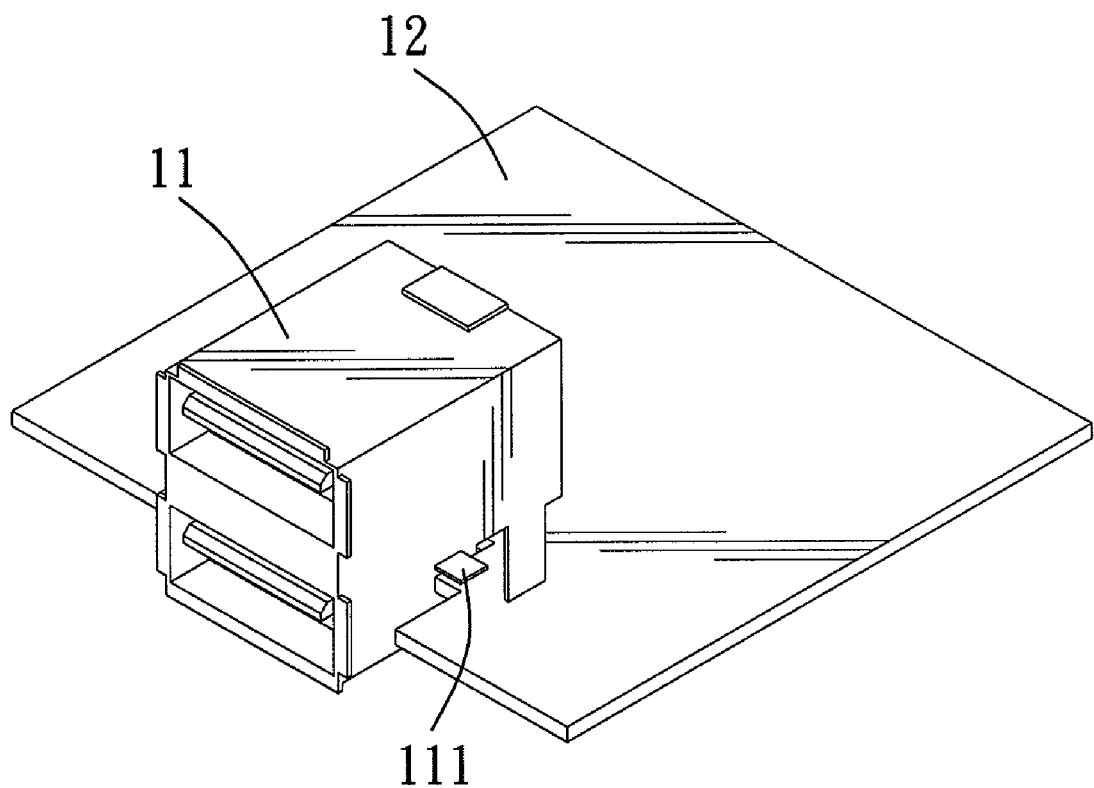
FIG. 1 is a perspective view of a conventional sinking type electrical connector mounted on a circuit board.
Figure 2:
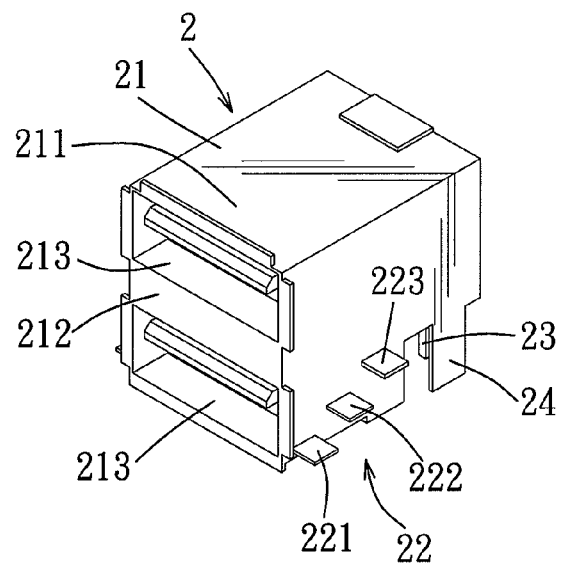
FIG. 2 is a perspective view of the first preferred embodiment of a sinking type electrical connector according to this invention.

Referring to FIG. 2, the first preferred embodiment of a sinking type electrical connector 2 of the present invention includes a body 21, a plurality of terminals 23 provided in the body 21, two insert pieces 24 extending downward from the body 21, and two limiting units 22. Because of the viewing angle, only one of each of the terminals 23, the insert pieces 24, and the limiting units 22 is visible in FIG. 2.

The body 21 of the electrical connector 2 has a front end portion 212, two connecting portions 213 provided in the front end portion 212, and a top surface 211. In particular, in this embodiment, the body 21 includes an insulation seat and a metal shell covering the insulation seat. The connecting portions 213 are formed in a front end portion of the insulation seat. The top surface 211 referred to herein may be a top surface of the metal shell. The terminals 23 are provided on the insulation seat, partly protrude outwardly of a rear side of the insulation seat, and bend and extend downwardly. The insert pieces 24 are formed at and extend downwardly from left and right sides of a rear portion of the metal shell, respectively.

The two limiting units 22 are provided at left and right sides of the body 21, respectively. In this embodiment, the limiting units 22 are connected to the metal shell of the body 21 and are located in front of the insert pieces 24. Each of the limiting units 22 includes three limiting portions 221, 222, 223 located at different levels. In this embodiment, each of the limiting portions 221, 222, 223 is a tab protruding laterally from the metal shell of the body 21. The limiting portions 221, 222, 223 are arranged out-of-line with each other in a front-and-rear direction.

Figure 3:
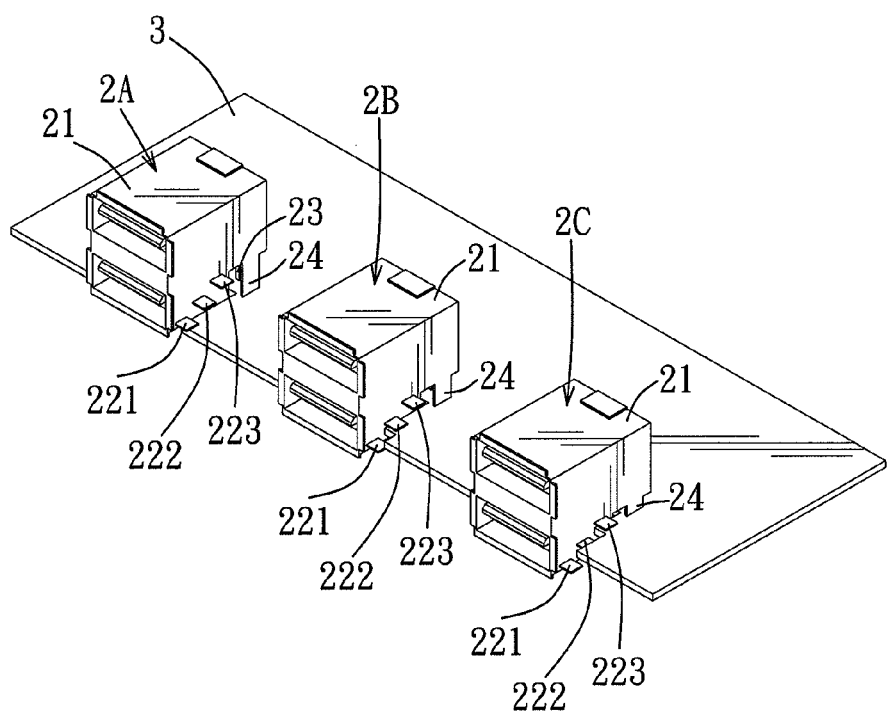
FIG. 3 is a perspective view to illustrate how the first preferred embodiment may be mounted on a circuit board at different sinking depths.
Figure 4:
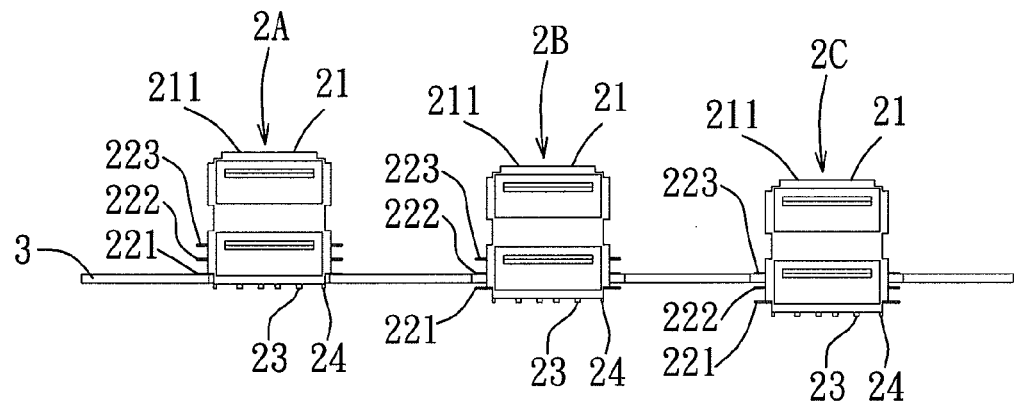
FIG. 4 is a front view of FIG. 3.
Figure 5:
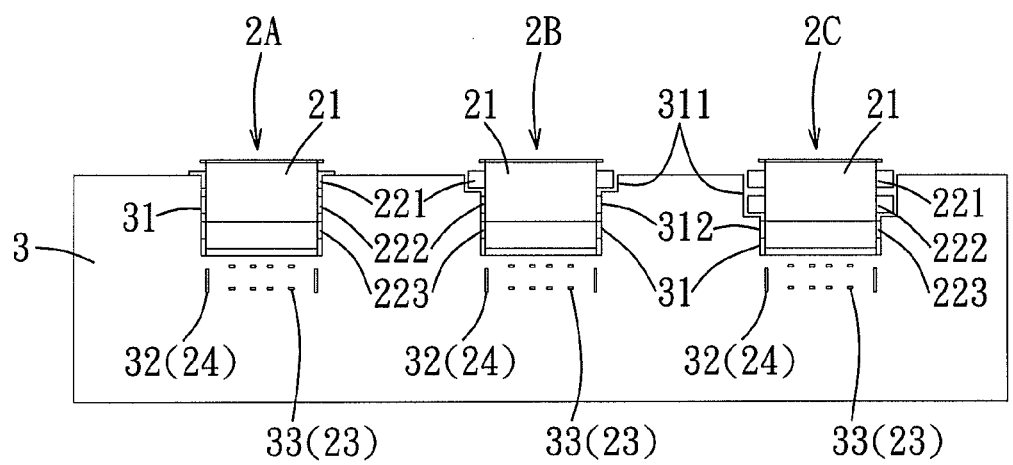
FIG. 5 is a bottom view of FIG. 3.

It should be noted that each of FIGS. 3 to 5 illustrates three situations in which the electrical connector 2 of this embodiment may be mounted on a circuit board 3. In the three situations, the limiting portions 221, 222, 223 of the limiting units 22 which are at different levels are respectively brought to engage the circuit board 3, so that a distance from the top surface 211 of the body 21 to the circuit board 3 is different in each situation (that is, the depth to which the electrical connector 2 sinks below the circuit board 3 is different in each situation). To facilitate description, the electrical connector 2 is referred to as electrical connector 2A, electrical connector 2B, and electrical connector 2C, respectively, in the three situations.

Referring to FIGS. 3 to 5, the circuit board 3 is provided with receiving recesses 31 for mounting the electrical connectors 2A, 2B, 2C, respectively. A plurality of terminal inserting holes 33 are provided in the circuit board 3 behind each of the receiving recesses 31, and a positioning hole 32 is provided at each of two sides of the terminal inserting holes 33. In this embodiment, each of the receiving recesses 31 is formed by indenting a front edge of the circuit board 3 rearwardly.

In this embodiment, when it is desired to couple the electrical connector 2 to the circuit board 3, the electrical connector 2 is coupled to the circuit board 3 along a downward direction so that downwardly extending portions of the terminals 23 extend through the terminal inserting holes 33, the insert pieces 24 at the left and right sides of the body 21 are respectively inserted into the two positioning holes 32 in the circuit board 3, and a corresponding pair of the limiting portions 221, 222, 223 of the limiting units 22 at the left and right sides of the body 21 abut against the circuit board 3. The distance from the top surface 211 of the body 21 to the circuit board 3 (i.e., the depth to which the electrical connector 2 sinks below the circuit board 3) can be varied by having a selected pair of the limiting portions 221, 222, 223 abutting against the circuit board 3.

In the situation of the electrical connector 2A, since the lowest limiting portions 221 at two sides of the electrical connector 2A abut against the circuit board 3 at two sides of the corresponding receiving recess 31, the distance from the top surface 211 of the electrical connector 2A to the circuit board 3 in this situation is comparatively the greatest, that is, the depth to which the electrical connector 2A sinks below the circuit board 3 is comparatively the smallest. As for the electrical connector 2B and the electrical connector 2C, because the limiting portions 222, 223 which are at higher levels abut against the circuit board 3, the distance from the top surface 211 of each of the electrical connectors 2B, 2C to the circuit board 3 is comparatively smaller, that is, the depth to which each of the electrical connectors 2B, 2C sinks below the circuit board 3 is comparatively greater.

It is worth noting that, in this embodiment, since the electrical connector 2 is positioned on the circuit board 3 by inserting the electrical connector 2 in the downward direction, when it is desired to couple the electrical connector 2 to the circuit board 3 at the sinking depth as in the situation of the electrical connector 2B or the electrical connector 2C, left and right sides of the receiving recess 31 in the circuit board 3 proximate to the front edge of the circuit board 3 are further indented laterally to an extent that the width of the further indentation at each side of the receiving recess 31 is at least equivalent to the width of one tab (i.e., one limiting portion 221, 222, 223) so that the receiving recess 31 can be divided into a first area 311 proximate to the front edge of the circuit board 3 and a second area 312 having a width smaller than that of the first area 311. Thus, when the electrical connector 2B is coupled to the circuit board 3 in the downward direction, the limiting portions 222 at two sides of the electrical connector 2B will abut against the circuit board 3 proximate to two lateral sides of the second area 312, and the limiting portions 221 in front of the limiting portions 222 can be extended through the circuit board 3 via the first area 311 in the downward direction so as not to affect coupling of the electrical connector 2B to the circuit board 3. Likewise, when the electrical connector 2C is coupled to the circuit board 3 in the downward direction, the limiting portions 223 at two sides of the electrical connector 2C will abut against the circuit board 3 proximate to two lateral sides of the second area 312, and the limiting portions 221, 222 in front of the limiting portions 223 can pass through the circuit board 3 via the first area 311 in the downward direction.

Since the limiting portions 221, 222, 223 in this embodiment are formed by bending parts of the metal shell outward and thus are also of a metal material, a grounding effect can be additionally achieved when the limiting portions 221, 222, 223 abut against the circuit board 3.

Figure 6:
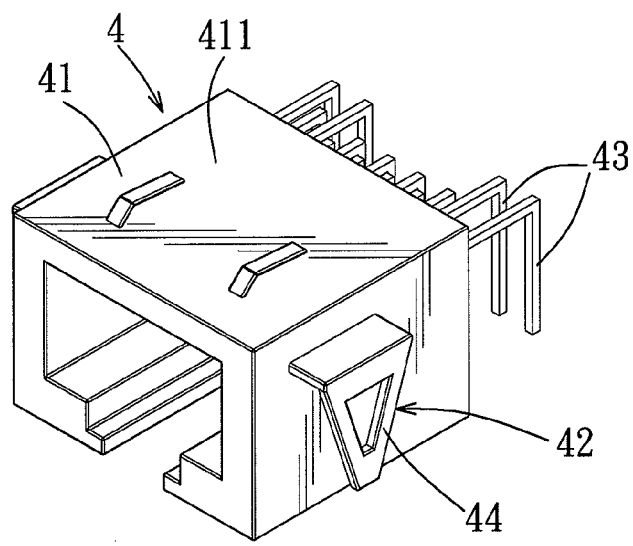
FIG. 6 is a perspective view of the second preferred embodiment of a sinking type electrical connector according to this invention.
Figure 7:
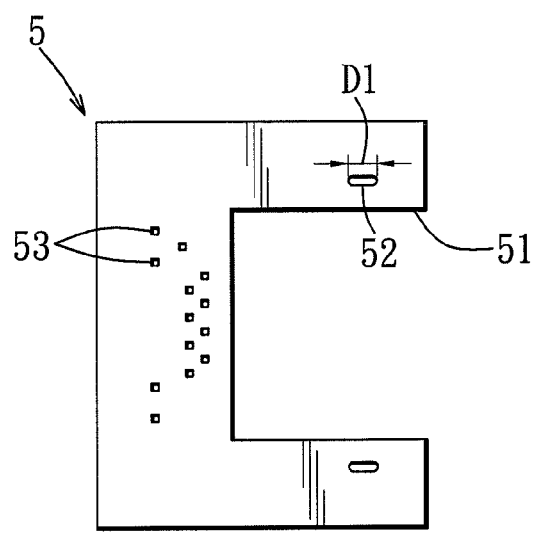
FIG. 7 is a top view of a circuit board that cooperates with the second preferred embodiment.

Referring to FIG. 6, the second preferred embodiment of a sinking type electrical connector 4 according to this invention includes a body 41, two insert pieces 44 respectively provided at left and right sides of the body 41, a plurality of terminals 43 provided in the body 41, and two limiting units 42 respectively provided at the left and right sides of the body 42.

In the second preferred embodiment, parts of the terminals 43 protrude outwardly of a rear side of the body 41, and bend and extend downwardly. The structures of the two limiting units 42 are coupled respectively and integrally with the two insert pieces 44. Each of the insert pieces 44 is connected to the body 41 at a top end portion thereof, extends convergently in the downward direction, and is of a substantially wedged shape. Each of the limiting units 42 has limiting portions 421 (see FIGS. 8A to 8C) which are portions of the insert pieces 44 at different levels.

Figure 8C:
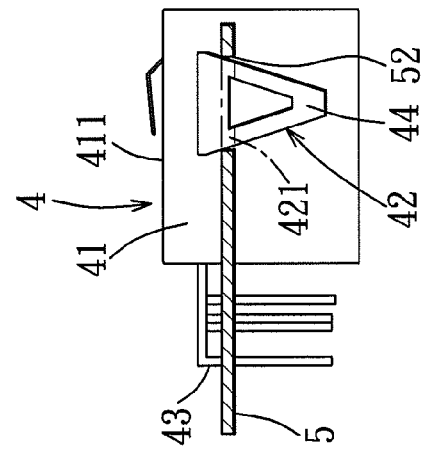
FIGS. 8A to 8C are side views of the second preferred embodiment when mounted on the circuit board at different sinking depths.
Figure 8B:
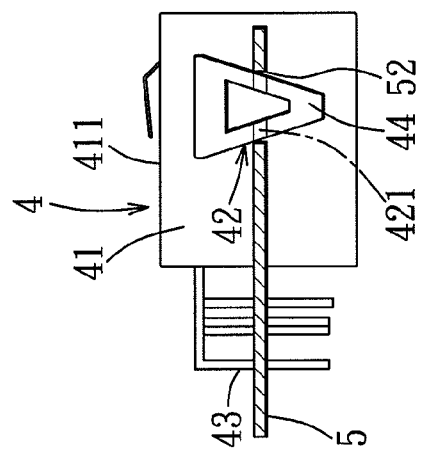
Figure 8A:
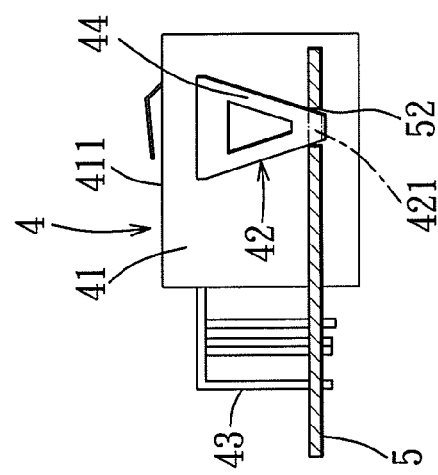

Referring to FIG. 7 and FIGS. 8A to 8C, it should be noted that FIGS. 8A to 8C respectively illustrate the situations in which the electrical connector 4 of the second preferred embodiment is coupled to a circuit board 5 such that the same sinks therebelow to different depths. When the electrical connector 4 is coupled to the circuit board 5 in the downward direction, a bottom portion of the body 41 is partly received in a receiving recess 51 in the circuit board 5, bent and downwardly extending portions of the terminals 43 are inserted into terminal inserting holes 53 in the circuit board 3, and the insert pieces 44 are correspondingly inserted into the positioning holes 52 in the circuit board 5. It is worth noting that, since the insert pieces 44 are of a downwardly converging wedged shape, when a width (D1) of the positioning holes 52 in the circuit board 5 is different, portions of the insert pieces 44 (i.e., the limiting portions 421) at a different level will abut against the circuit board 5 when the insert pieces 44 are inserted into the positioning holes 52, so that the depth to which the insert pieces 44 are inserted into the positioning holes 52 is different. Thus, a distance from the top surface 411 of the body 41 to the circuit board 5 is changeable, thereby achieving the object of adjusting the depth to which the electrical connector 4 can sink below the circuit board 5.

In general, electronic parts are classified into two types, i.e., dual inline package (DIP) and surface mount device (SMD), and the primary difference is whether signal pins thereof extend through a circuit board. The signal pins of a DIP extend through a circuit board, whereas the signal pins of a SMD are mounted using surface mounting technology and do not extend through a circuit board. Therefore, the first and second preferred embodiments of this invention are designs suitable for the DIP, and a different design is required for the SMD.

Figure 9:
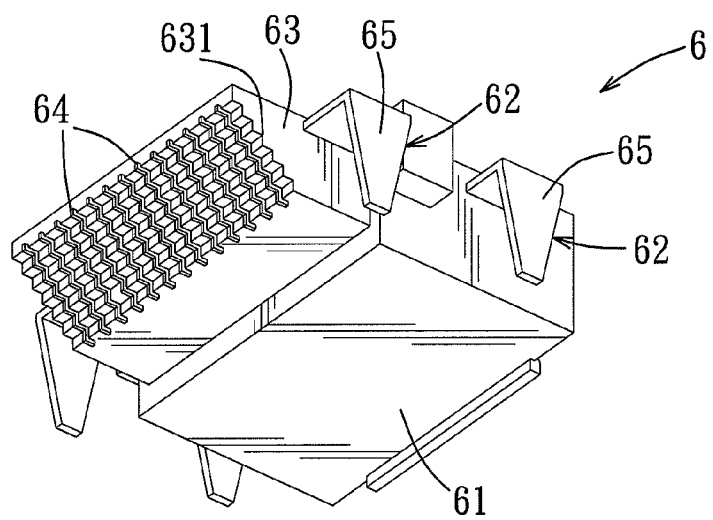
FIG. 9 is a perspective view of the third preferred embodiment of a sinking type electrical connector according to this invention.
Figure 10:
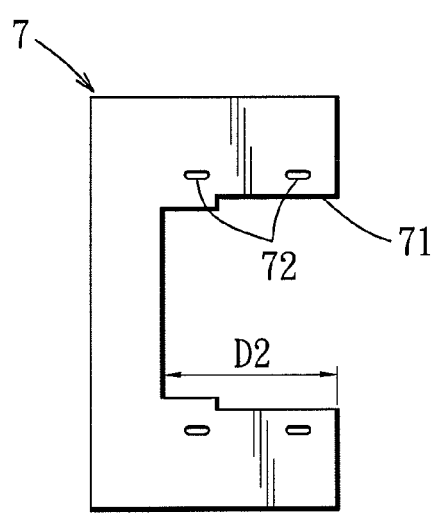
FIG. 10 is a top view of a circuit board that cooperates with the third preferred embodiment.

Referring to FIG. 9, the third preferred embodiment of a sinking type electrical connector 6 according to this invention is a design suitable for SMDs, and includes a body 61, a protruding block 63 connected to the body 61, four insert pieces 65, and four limiting units 62. Two of the four insert pieces 65 protrude laterally from left and right sides of the body 61, and the other two of the insert pieces 65 protrude laterally from left and right sides of the protruding block 63.

The structure of each of the limiting units 62 is coupled integrally with a corresponding one of the insert pieces 65. The insert pieces 65 and the limiting units 62 are substantially identical in structure to those of the second preferred embodiment, and thus will not be described further for the sake of brevity.

In this embodiment, the protruding block 63 protrudes rearwardly from a rear side of the body 61, and has a stepped bottom surface part 631 integrally extending rearwardly and upwardly. Furthermore, in this embodiment, terminals 64 of the electrical connector 6 protrude rearwardly from the bottom surface part 631 of the protruding block 63 and are likewise stepped.

Figure 11A:
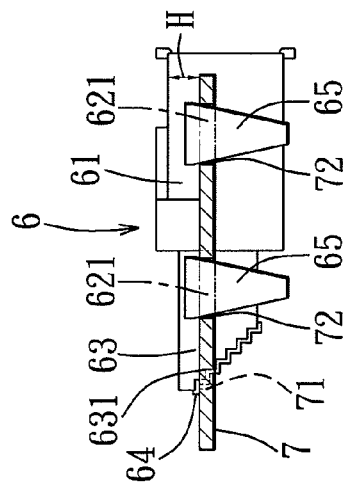
FIGS. 11A to 11C are side views of the third preferred embodiment when mounted on the circuit board at different sinking depths.
Figure 11B:
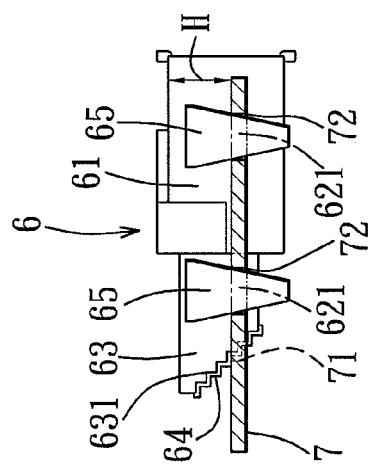
Figure 11C:
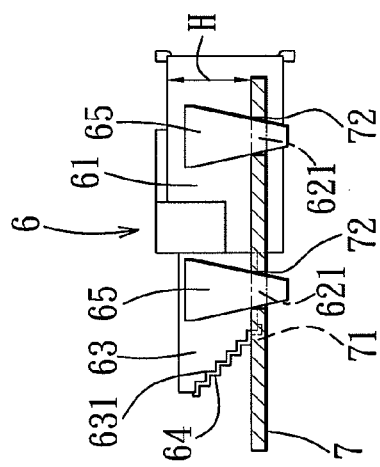

Referring to FIG. 10 and FIGS. 11A to 11C, when the electrical connector 6 is coupled to the circuit board 7, the insert pieces 65 at two sides of the body 61 and at two sides of the protruding block 63 are respectively inserted into positioning holes 72 in the circuit board 7. When the width of the positioning holes 72 is different, the insert pieces 65 are inserted into the positioning holes 72 such that different portions of the insert pieces 65 (i.e., the limiting portions 621) which are at a different level abut against the circuit board 7 so as to adjust the depth to which the electrical connector 6 sinks below the circuit board 7. Specifically, since the bottom surface part 631 of the protruding block 63 is stepped, when the electrical connector 6 is insertably mounted on the circuit board 7 through the insert pieces 65 and is positioned at a certain height (H) as shown in FIGS. 11A to 11C, one of steps of the bottom surface part 631 of the protruding block 63 which is at a level corresponding to the height (H) is brought to abut against the circuit board 7 so as to assist in positioning of the electrical connector 6 at the height (H). Stepped portions of the terminals 64 which are exposed outwardly of the bottom surface part 631 of the protruding block 63 can be correspondingly welded onto the circuit board 7.

It should be particularly noted that, since the steps of the bottom surface part 631 of the protruding block 63 extend rearwardly and upwardly, a recess depth (D2) of the receiving recess 71 in the circuit board 7 can be varied according to the sinking depth of the electrical connector 6. In other words, the recess depth (D2) of the receiving recess 71 is determined according to a depth to which the electrical connector 6 is configured to sink below the circuit board 7.

Figure 12:
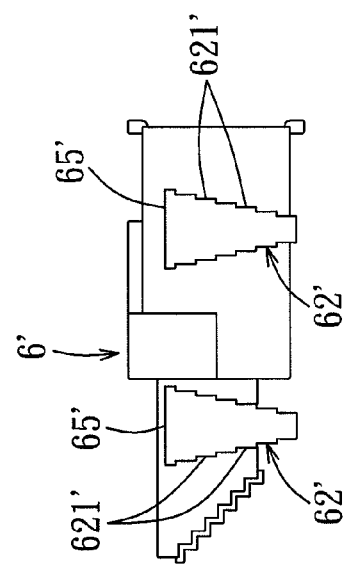
FIG. 12 is a side view of the fourth preferred embodiment of a sinking type electrical connector according to this invention.

Referring to FIG. 12, the fourth preferred embodiment of a sinking type electrical connector 6' according to this invention is a design also suitable for SMDs, and is different from the third preferred embodiment in that lateral edges of the insert pieces 65' in this embodiment are stepped and converge downwardly so that the limiting portions 621' of the limiting units 62' are relatively distinctive. The object of adjusting the sinking depth of the electrical connector 6' can be likewise achieved. The components of the electrical connector 6' are identical to those of the third preferred embodiment, and thus will not be described herein for the sake of brevity.

It should be noted that, although the numbers of the limiting units 22, 42, 62, 62' are specifically stated in the above preferred embodiments, the limiting units 22, 42, 62, 62' can be in any number that is more than one, and should not be limited to the disclosure.

In sum, by means of the limiting units 22, 42, 62, 62' which include a plurality of the limiting portions 221, 222, 223, 421, 621, 621' located at different levels, the depth to which the electrical connector 2, 4, 6, 6' can sink below the circuit board 3, 5, 7 can be adjusted by positioning a corresponding one of the limiting portions 221, 222, 223, 421, 621, 621' on the circuit board 3, 5, 7, thereby saving the cost and time required for developing a new electrical connector adapted for a different sinking depth, and reducing inventory cost associated with stocking electrical connectors of different specifications.

While the present invention has been described in connection with what are considered the most practical and preferred embodiments, it is understood that this invention is not limited to the disclosed embodiments but is intended to cover various arrangements included within the spirit and scope of the broadest interpretation so as to encompass all such modifications and equivalent arrangements.

We claim:

1. A sinking type electrical connector adapted to be coupled to a circuit board, said sinking type electrical connector comprising:
    a body having a front end portion, a connecting portion provided in said front end portion, and a top surface; and
    at least one limiting unit provided at one side of said body and including a plurality of limiting portions respectively located at different levels, a selected one of said limiting portions of said limiting unit which are at different levels being brought to engage the circuit board so that a distance from said top surface of said body to the circuit board is changeable.

2. The sinking type electrical connector as claimed in claim 1, wherein said limiting portions are tabs protruding laterally from said body.

3. The sinking type electrical connector as claimed in claim 2, wherein said tabs are arranged out-of-line with each other in a front-and-rear direction.

4. The sinking type electrical connector as claimed in claim 3, further comprising at least one insert piece extending downwardly from said body for insertion into the circuit board.

5. The sinking type electrical connector as claimed in claim 1, further comprising at least one insert piece extending downwardly from said body for insertion into the circuit board.

6. The sinking type electrical connector as claimed in claim 5, wherein said insert piece extends convergently in a downward direction, said limiting portions being portions of said insert piece at different levels.

7. The sinking type electrical connector as claimed in claim 6, wherein said insert piece is of a substantially wedged shape.

8. The sinking type electrical connector as claimed in claim 6, wherein said insert piece has two lateral edges which are stepped.

9. The sinking type electrical connector as claimed in claim 6, further comprising a protruding block protruding from another side of said body and having a stepped bottom surface part.

10. The sinking type electrical connector as claimed in claim 9, further comprising a plurality of terminals provided in said body, said terminals protruding outwardly of said bottom surface part of said protruding block and being stepped.

11. The sinking type electrical connector as claimed in claim 10, wherein said protruding block protrudes from a rear side of said body, said bottom surface part extending rearwardly and upwardly.

12. An assembly of a sinking type electrical connector and a circuit board, comprising:
    a circuit board provided with a receiving recess and at least one positioning hole; and
    a sinking type electrical connector including:
        a body having a front end portion, a connecting portion provided in said front end portion, and a top surface;
        at least one insert piece which corresponds in number to said positioning hole, and which extends downwardly from said body for insertion into said positioning hole such that said body is received and positioned in said receiving recess; and
        at least one limiting unit provided at one side of said body and including a plurality of limiting portions respectively located at different levels, a selected one of said limiting portions of said limiting unit which are at different levels being brought to engage said circuit board so that a distance from said top surface of said body to said circuit board is changeable.

13. The assembly of a sinking type electrical connector and a circuit board as claimed in claim 12, wherein said limiting portions are tabs protruding laterally from said body, one of said tabs abutting against said circuit board when said sinking type electrical connector is coupled to said circuit board.

14. The assembly of a sinking type electrical connector and a circuit board as claimed in claim 13, wherein said tabs are arranged out-of-line with each other in a front-and-rear direction.

15. The assembly of a sinking type electrical connector and a circuit board as claimed in claim 12, wherein said insert piece extends convergently in a downward direction, said limiting portions being portions of said insert piece at different levels.

16. The assembly of a sinking type electrical connector and a circuit board as claimed in claim 15, wherein said insert piece is of a substantially wedged shape.

17. The assembly of a sinking type electrical connector and a circuit board as claimed in claim 15, wherein said insert piece has two lateral edges which are stepped.

18. The assembly of a sinking type electrical connector and a circuit board as claimed in claim 15, wherein said sinking type electrical connector further includes a protruding block protruding from another side of said body and having a stepped bottom surface part.

19. The assembly of a sinking type electrical connector and a circuit board as claimed in claim 18, wherein said sinking type electrical connector further includes a plurality of terminals provided in said body, said terminals protruding outwardly of said bottom surface part of said protruding block and being stepped.

20. The assembly of a sinking type electrical connector and a circuit board as claimed in claim 19, wherein said protruding block protrudes from a rear side of said body, said bottom surface part extending rearwardly and upwardly.

* * * * *